US009494626B2

(12) United States Patent
Wataru

(10) Patent No.: US 9,494,626 B2
(45) Date of Patent: Nov. 15, 2016

(54) CONSTANT PERIOD SIGNAL MONITORING CIRCUIT AND LOAD CONTROL BACKUP SIGNAL GENERATING CIRCUIT

(71) Applicant: Yazaki Corporation, Tokyo (JP)

(72) Inventor: Kazuhisa Wataru, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/729,485

(22) Filed: Jun. 3, 2015

(65) Prior Publication Data

US 2015/0355250 A1 Dec. 10, 2015

(30) Foreign Application Priority Data

Jun. 9, 2014 (JP) ................. 2014-118840

(51) Int. Cl.
*H03K 5/19* (2006.01)
*G01R 23/02* (2006.01)
*H03K 17/56* (2006.01)

(52) U.S. Cl.
CPC ............. *G01R 23/02* (2013.01); *H03K 17/56* (2013.01); *Y02T 10/40* (2013.01)

(58) Field of Classification Search
None
See application file for complete search history.

(56) References Cited

U.S. PATENT DOCUMENTS

| 6,259,666 B1* | 7/2001 | Kobayashi | ........... G11B 7/0045 369/116 |
| 2010/0004811 A1 | 1/2010 | Kannan et al. | |
| 2015/0234696 A1* | 8/2015 | Wataru | ................... G01R 31/00 714/55 |

FOREIGN PATENT DOCUMENTS

| JP | 2010-13988 A | 1/2010 |
| JP | 2011-98593 A | 5/2011 |

\* cited by examiner

*Primary Examiner* — Long Nguyen
(74) *Attorney, Agent, or Firm* — Sughrue Mion, PLLC

(57) ABSTRACT

A constant period signal monitoring circuit for monitoring a constant period signal that is output periodically when a control processor operating according to a program is normal, includes a signal input terminal that receives the constant period signal, an edge detection section that detects a change of the constant period signal appearing at the signal input terminal from a low level to a high level or from a high level to a low level as an edge of the constant period signal, and a time measuring section that measures a length of the time during which a state of not detecting the edge continues on the basis of an output of the edge detection section and outputs an abnormality detection signal in a case that the measured time exceeds a threshold value.

7 Claims, 5 Drawing Sheets

CONSTANT PERIOD SIGNAL MONITORING CIRCUIT AND LOAD CONTROL BACKUP SIGNAL GENERATING CIRCUIT

CROSS REFERENCE TO RELATED APPLICATIONS

The present application is based on Japanese Patent Application No. 2014-118840 filed on Jun. 9, 2014, the contents of which are incorporated herein by reference.

BACKGROUND

The present invention relates to a constant period signal monitoring circuit for monitoring a predetermined constant period signal that is output periodically when a control processor operating according to a predetermined program is normal from the outside of the control processor.

A control micro-processor, i.e., a microcomputer (CPU: central processing unit), operating according to a predetermined program is incorporated in various electric control units (ECUs) to be mounted on vehicles.

Such a microcomputer usually carries out various controls as intended according to the content of a program prepared beforehand. However, for example, in the case that the microcomputer is affected due to electromagnetic noise entering from the outside, in the case that the microcomputer becomes faulty, or in the case that the microcomputer is affected due to defects (bugs) contained in the program itself, the microcomputer may sometimes cause an unexpected operation and may be brought into a runaway state.

If the microcomputer is brought into such a runaway state, the entire electric control unit falls into an uncontrollable state. Hence, in the systems of such various electric control units, it is necessary to monitor whether abnormality has occurred in the microcomputer, and in the case that the occurrence of abnormality is detected, it is necessary to return the microcomputer to its normal state.

Hence, in such various electric control units, the microcomputer performs control so as to periodically output pulses referred to as a watchdog signal to the outside. Furthermore, a monitoring circuit is connected to the outside of the microcomputer, and this monitoring circuit always monitors the watchdog signal output from the microcomputer. If abnormality occurs in the microcomputer, the watchdog signal does not appear. Upon detecting the state in which the watchdog signal does not appear for a constant time, the monitoring circuit initializes the operation of the microcomputer.

In the on-vehicle electronic control unit according to JP-A-2010-13988, if the main CPU 10 shown in FIG. 1 is brought into a runaway state and the pulse width of a watchdog signal WDS becomes excessively large, a power control circuit 113 detects this state and generates a reset pulse signal RST.

Also in the vehicle-use electronic control system according to JP-A-2011-98593, the watchdog timer 24 incorporated in a power source control IC 23 monitors the operation state of a CPU 1 on the basis of the watchdog signal transmitted from the CPU 1 and transmits a reset signal RST when abnormality occurs.

As described in JP-A-2010-13988 and JP-A-2011-98593, abnormality in the operation of the microcomputer can be detected by monitoring the watchdog signal output from the microcomputer. In addition, upon detecting abnormality, the circuit for monitoring the watchdog signal applies the reset signal to the microcomputer. When the reset signal is applied, the microcomputer initializes the state of the hardware and restarts the execution of the program from the head position thereof as at the time of power supply.

Hence, in the case that the microcomputer is brought into a runaway state due to a temporary factor, such as the entry of electromagnetic noise, the operation of the microcomputer can be returned to its normal state by applying the reset signal.

However, in the case that a continuous failure occurs inside the microcomputer, the operation of the microcomputer cannot be returned to its normal state even if the reset signal is applied. Furthermore, in the case that a failure occurs in the microcomputer provided in an electronic control unit for on/off controlling the energization of a load, the energization of the load cannot be turned on/off even in the case that a circuit for monitoring the watchdog signal is mounted.

Hence, it is desirable that a backup circuit should be mounted on an on-vehicle electronic control unit or the like in preparation for the occurrence of a failure in the microcomputer. In other words, instead of the microcomputer, a circuit for generating a backup control signal for controlling a load is necessary so that the energization of the load can be turned on/off even in the case that the microcomputer is faulty.

However, in the case that the program of the microcomputer is brought into a runaway state, the state of the output port of the microcomputer from which the watchdog signal is output becomes uncertain. That is to say, there occurs a case in which a low level (a potential close to 0 V) is output or a case in which a high level (a potential close to 5 V) is output from the output port.

Hence, in the circuit for monitoring the watchdog signal, it is necessary to ignore the DC potential of the signal and to monitor only the change in potential (AC components). In an electric circuit for this kind of use, it is a general practice that a capacitor is connected to the input of the monitoring circuit to shut off DC components.

A configuration example of the monitoring circuit in which a capacitor is connected to the input is shown in FIG. 4. In addition, examples of signal waveforms at various sections in the monitoring circuit are shown in FIG. 5.

In the monitoring circuit shown in FIG. 4, the watchdog signal w/D output periodically from the microcomputer is applied to an input terminal 54. This watchdog signal is input to the clear terminal CLR of a counter 51 via a capacitor C1 for shutting off DC components. Furthermore, the clear terminal of the counter 51 is grounded via a resistor R1. Moreover, the clock pulse signal CLK output from a clock generator 53 is applied to the clock input terminal CK of the counter 51.

When the level of the output signal of the counter 51 becomes "Hi", the D-type flip-flop 52 connected to the output terminal Q3 of the counter 51 latches this state and generates a backup control signal SGbk.

As shown in FIG. 5, when the potential of a clear signal SGcr is lower than a clear threshold value, the counter 51 shown in FIG. 4 counts the number of the dock pulses CLK. Furthermore, when the potential of the clear signal SGcr is higher than the clear threshold value, the counter 51 clears the count value.

Since a time constant circuit including the capacitor C1 is used in the monitoring circuit in FIG. 4, the potential of the clear signal SGcr changes depending on the time constant of the circuit. Hence, as shown in FIG. 5, the time (clear time) during which the counter 51 maintains its clear state becomes relatively long. Furthermore, the backup recovery time from the stop of the watchdog signal W/D to the output of the backup control signal SGbk becomes long due to the influence of the clear time as shown in FIG. 5. In other words, in an electronic control unit for controlling the energization of a load, in the case that the microcomputer thereof becomes faulty, the backup control signal SGbk cannot be output quickly, whereby the time during which the load cannot be controlled becomes long. In addition, in a situation in which variation in the characteristic of the capacitor C1 due to individual differences is large, large variation may occur in the length of the backup recovery time.

SUMMARY

The present invention is made in consideration of the above-mentioned circumstances, and the object of the invention is to provide a constant period signal monitoring circuit and a load control backup signal generating circuit capable of quickly detecting the occurrence of abnormality in the case that a control circuit composed of a microcomputer or the like becomes faulty.

In order to attain the above-mentioned object, a constant period signal monitoring circuit according to the present invention has the characteristics described in the following items (1) to (6).

(1) A constant period signal monitoring circuit for monitoring a constant period signal that is output periodically when a control processor operating according to a program is normal from the outside of the control processor, the monitoring circuit including:
  a signal input terminal that receives the constant period signal;
  an edge detection section that detects a change of the constant period signal appearing at the signal input terminal from a low level to a high level or from a high level to a low level as an edge of the constant period signal; and
  a time measuring section that measures a length of the time during which a state of not detecting the edge continues on the basis of an output of the edge detection section and outputs an abnormality detection signal in a case that the measured time exceeds a threshold value.

(2) The constant period signal monitoring circuit configured as described in the above-mentioned item (1), wherein the edge detection section includes:
  a positive edge detection section that detects the change of the constant period signal appearing at the signal input terminal from the low level to the high level as a positive edge of the constant period signal; and
  a negative edge detection section that detects the change of the constant period signal appearing at the signal input terminal from the high level to the low level as a negative edge of the constant period signal; and
  wherein the time measuring section measures a length of the time during which a state of not detecting the positive edge and the negative edge continues on the basis of an output of the positive edge detection section and an output of the negative edge detection section and outputs the abnormality detection signal in the case that the measured time exceeds a threshold value.

(3) The constant period signal monitoring circuit configured as described in the above-mentioned item (2), wherein the time measuring section includes a clear signal generating section that generates a signal for clearing the measured time when the positive edge detection section detects the positive edge or when the negative edge detection section detects the negative edge.

(4) The constant period signal monitoring circuit configured as described in the above-mentioned item (2), wherein the positive edge detection section outputs a positive edge pulse signal when the detection section detects the positive edge; and
  wherein the negative edge detection section outputs a negative edge pulse signal when the detection section detects the negative edge.

(5) The constant period signal monitoring circuit configured as described in the above-mentioned item (4), wherein the positive edge detection section includes:
  a first flip-flop that is set when the detection section detects the positive edge; and
  a first delay circuit that automatically resets the first flip-flop after the first flip-flop is set; and
  wherein the negative edge detection section includes:
  a second flip-flop that is set when the detection section detects the negative edge; and
  a second delay circuit that automatically resets the second flip-flop after the second flip-flop is set.

(6) The constant period signal monitoring circuit configured as described in the above-mentioned item (2), wherein the time measuring section includes:
  a clock generating section that outputs dock pulses having a constant period; and
  a counter that counts the number of the dock pulses.

With the constant period signal monitoring circuit configured as described in the above-mentioned item (1), since time is measured on the basis of the timing at which the edge of the constant period signal is detected, it is not necessary to use a capacitor for shutting off DC components. Hence, the measurement is not affected by the time constant of a CR circuit. In other words, in the case that the constant period signal, such as a watchdog signal, stops, this abnormality can be detected in a minimum time.

With the constant period signal monitoring circuit configured as described in the above-mentioned item (2), since time is measured on the basis of the timing at which the positive and negative edges of the constant period signal are detected, it is not necessary to use a capacitor for shutting off DC components. Hence, the measurement is not affected by the time constant of a CR circuit. In other words, in the case that the constant period signal, such as a watchdog signal, stops, this abnormality can be detected in a minimum time.

With the constant period signal monitoring circuit configured as described in the above-mentioned item (3), since the measured time can be cleared when the positive edge is detected and when the negative edge is detected, it is possible to measure only the time during which the constant period signal stops.

With the constant period signal monitoring circuit configured as described in the above-mentioned item (4), since pulses are output at the respective timings when the positive edge and the negative edge are detected, the timings can be controlled easily on the basis of these pulses.

With the constant period signal monitoring circuit configured as described in the above-mentioned item (5), pulses can be output at the respective timings when the positive edge and the negative edge are detected.

With the constant period signal monitoring circuit configured as described in the above-mentioned item (6), since time is measured by counting the number of the clock pulses, time measurement can be performed with relatively high accuracy.

In order to attain the above-mentioned object, a load control backup signal generating circuit according to the present invention has the characteristic described in the following item (7).

(7) A load control backup signal generating circuit for supplying a backup control signal to a switch of a load connected to an output of a control processor operating according to a program in a case that abnormality occurs in the control processor, the circuit including:

a signal input terminal that receives a constant period signal that is output periodically when the control processor is normal;

an edge detection section that detects a change of the constant period signal appearing at the signal input terminal from a low level to a high level or from a high level to a low level as an edge of the constant period signal;

a time measuring section that measures a length of the time during which a state of not detecting the edge continues on the basis of an output of the edge detection section and that outputs an abnormality detection signal in a case that the measured time exceeds a threshold value; and a backup signal output section that generates the backup control signal when the abnormality detection signal appears at the output of the time measuring section.

With the load control backup signal generating circuit configured as described in the above-mentioned item (7), since time is measured on the basis of the timing at which the edge of the constant period signal is detected, it is not necessary to use a capacitor for shutting off DC components. Hence, the measurement is not affected by the time constant of a CR circuit. In other words, in the case that the constant period signal, such as a watchdog signal, stops, this abnormality can be detected in a minimum time and the backup control signal can be output.

With the constant period signal monitoring circuit and the load control backup signal generating circuit according to the present invention, in the case that a control circuit composed of a microcomputer or the like becomes faulty, the occurrence of the abnormality can be detected quickly.

The present invention has been described above briefly. The details of the present invention will be further clarified by reading the description of the mode (hereafter referred to as "embodiment") for carrying out the invention that is described below while referring to the accompanying drawings.

DETAILED DESCRIPTION OF EXEMPLARY EMBODIMENTS

Figure 1:
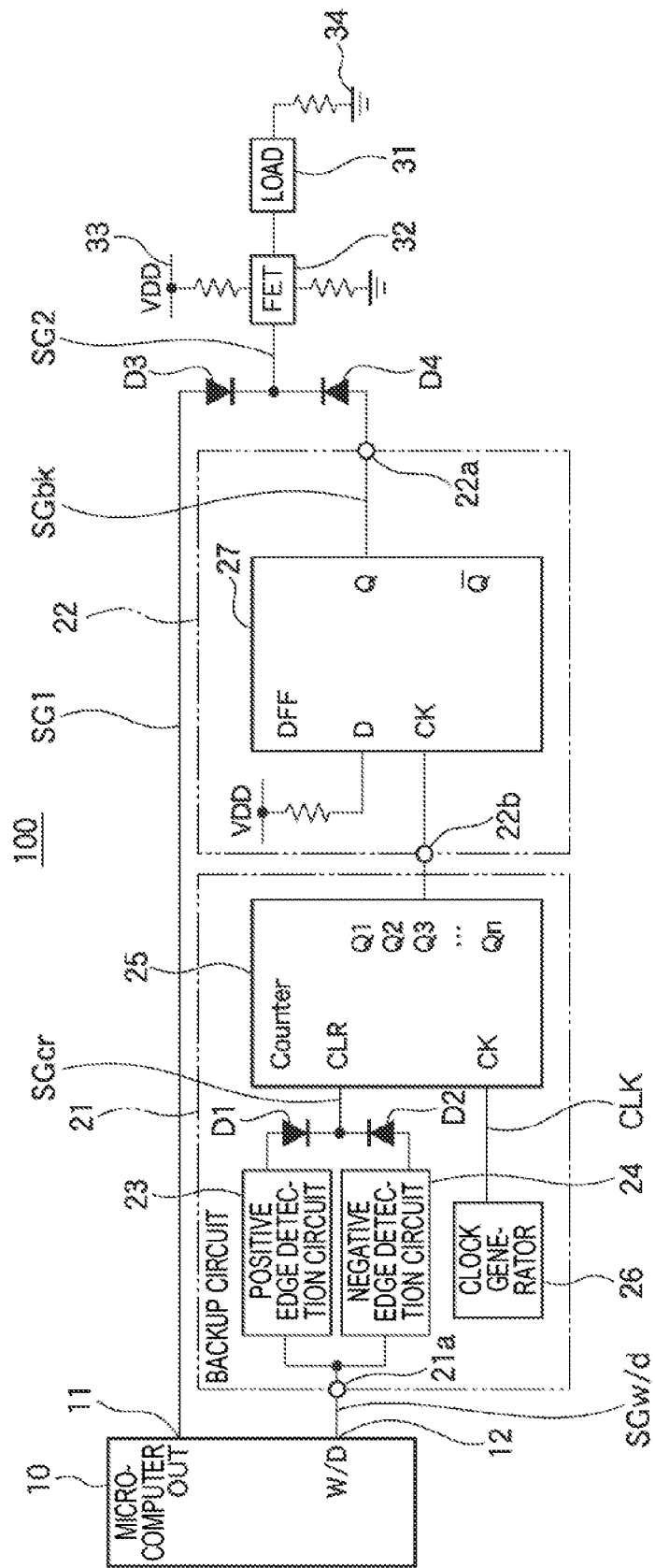
FIG. 1 is an electric circuit diagram showing a configuration example of an electronic control unit including a load control backup signal generating circuit according to an embodiment.

A specific embodiment relating to a constant period signal monitoring circuit and a load control backup signal generating circuit according to the present invention will be described below referring to the drawings.

<Description of a Configuration Example>
<General Description of the Entire Control Unit>

A configuration example of the main section of an electronic control unit 100 including a constant period signal monitoring circuit 21 and a backup signal generating section 22 according to this embodiment is shown in FIG. 1.

The electronic control unit 100 shown in FIG. 1 includes a microcomputer 10 serving as a main control section. The microcomputer 10 can perform control for realizing functions required for the electronic control unit by executing programs incorporated beforehand in an internal memory (ROM), for example.

In the configuration example shown in FIG. 1, the microcomputer 10 outputs a control signal SG1, such as a simple binary signal or a PWM (pulse width modulation) signal, to an output port 11 depending on a detected state, thereby being capable of controlling the energization of a load 31.

Each of various on-vehicle electric components can be assumed as a specific example of the load 31. Furthermore, a switching device 32 composed of a power FET controls the on/off state of the energization of the load 31 according to the on/off (high level/low level) state of an energization control signal SG2, such as a PWM signal or a binary signal.

By the processing of the microcomputer 10, the energization control signal SG2 for controlling the load 31 usually changes depending on the control signal SG1 that is output to the output port 11 of the microcomputer. However, a continuous or temporary failure may occur in the microcomputer 10 in some cases. If the microcomputer 10 fails, the control signal SG1 does not change, whereby the microcomputer is brought into a state of being unable to perform the on/off control of the load 31.

The backup signal generating section 22 is mounted as a backup in the case that the microcomputer 10 becomes faulty. In other words, when abnormality occurs in the microcomputer 10 and the control signal SG1 to be output normally is not output properly, a backup control signal SGbk output from the backup signal generating section 22, instead of the microcomputer 10, controls the load 31.

The constant period signal monitoring circuit 21 monitors the watchdog signal SGw/d that is output periodically from the microcomputer 10, thereby identifying the presence or absence of the occurrence of abnormality in the microcomputer 10. The backup signal generating section 22 generates the backup control signal SGbk on the basis of the output of the constant period signal monitoring circuit 21.

The output port 11 of the microcomputer 10 is connected to the control input (gate terminal) of the switching device 32 via a reverse flow preventing diode D3. Furthermore, the output of the backup signal generating section 22 is connected to the control input of the switching device 32 via a diode D4.

Hence, when the microcomputer 10 becomes faulty and the control signal SG1 is not output, the switching device 32 can be turned on/off depending on the backup control signal SGbk that is input via the diode D4. Moreover, if the backup control signal SGbk can be output immediately after the control signal SG1 is not output, the time during which the load 31 cannot be controlled can be minimized.

<Description of the Constant Period Signal Monitoring Circuit 21>

The constant period signal monitoring circuit 21 shown in FIG. 1 includes a watchdog input terminal 21a connected to the watchdog signal output port 12 of the microcomputer 10. In other words, the constant period signal monitoring circuit 21 monitors the watchdog signal SGw/d serving as a constant period signal and identifies the presence or absence of abnormality.

In addition, a positive edge detection circuit 23, a negative edge detection circuit 24, diodes D1 and D2, a counter 25 and a clock generator 26 are provided inside the constant period signal monitoring circuit 21.

Both the input terminals of the positive edge detection circuit 23 and the negative edge detection circuit 24 are connected to the watchdog input terminal 21a. Furthermore, the output terminal of the positive edge detection circuit 23 is connected to the clear input terminal CLR of the counter 25 via the diode D1, and the output terminal of the negative edge detection circuit 24 is connected to the clear input terminal CLR of the counter 25 via the diode D2.

Upon detecting the change in the level of the watchdog signal SGw/d at the watchdog input terminal 21a from a low level (Lo) to a high level (Hi), that is, the rising edge of the signal, the positive edge detection circuit 23 outputs a pulse. Moreover, upon detecting the change in the level of the watchdog signal SGw/d at the watchdog input terminal 21a from a high level (Hi) to a low level (Lo), that is the falling edge of the signal, the negative edge detection circuit 24 outputs a pulse.

Since both the output of the positive edge detection circuit 23 and the output of the negative edge detection circuit 24 are connected to the clear input terminal CLR of the counter 25, the count value of the counter 25 can be cleared at the timing when the positive edge detection circuit 23 detects the positive edge of the signal and when the negative edge detection circuit 24 detects the negative edge of the signal. In other words, the clear signal SGcr to be applied to the clear input terminal CLR of the counter 25 is the logical OR of the pulse signal output from the positive edge detection circuit 23 and the pulse signal output from the negative edge detection circuit 24.

The counter 25 has a clock input terminal CK and n-bit output terminals Q1, Q2, Q3, . . . , Qn in addition to the clear input terminal CLR. When an effective clear signal level ("Hi" in this embodiment) is not applied to the clear input terminal CLR, the counter 25 counts the number of the pulses of the clock pulse signal CLK to be applied to the clock input terminal CK. Accordingly, the binary numerical values obtained as the result of the counting appear as binary signals (Hi/Lo) at the output terminals Q1, Q2, Q3, . . . , Qn. In the example shown in FIG. 1, the signal "Hi" at the output terminal Q3 of the counter 25 is used as an effective abnormality detection signal.

The clock generator 26 always outputs the clock pulse signal CLK having a constant period. Although the clock generator 26 can be constituted as, for example, a crystal oscillator, an inexpensive oscillation circuit including a CR time constant circuit composed of a capacitor and a resistor can also be used for uses not requiring high accuracy. The accuracy of abnormality detection time can be improved by making the period of the clock pulse signal CLK sufficiently shorter than the pulse period of the watchdog signal SGw/d to be monitored.

<Description of the Positive Edge Detection Circuit 23 and the Negative Edge Detection Circuit 24>

Figure 2:
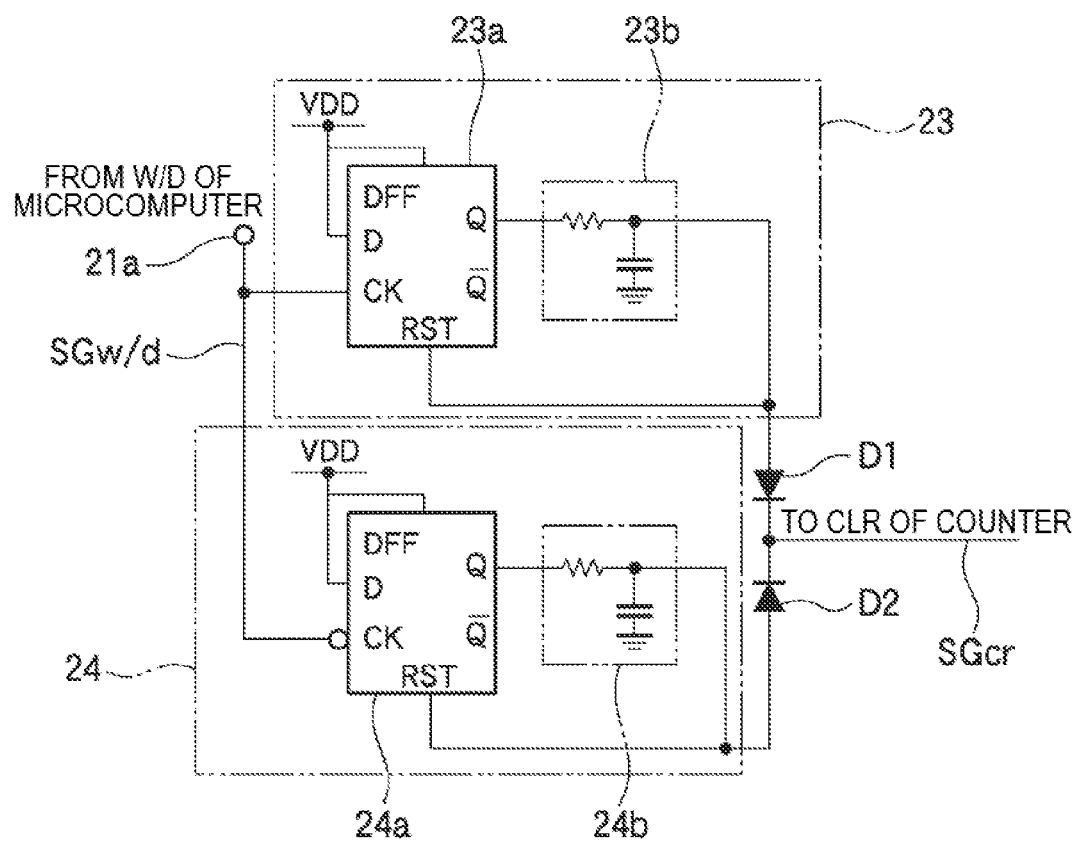
FIG. 2 is an electric circuit diagram showing a detailed configuration of part of the circuit shown in FIG. 1.

FIG. 2 shows a detailed configuration of part of the circuit shown in FIG. 1. That is to say, FIG. 2 shows detailed configuration examples of the positive edge detection circuit 23 and the negative edge detection circuit 24 shown in FIG. 1.

In the example shown in FIG. 2, the positive edge detection circuit 23 includes a D-type flip-flop (DFF) 23a and a delay circuit 23b. The data input terminal (D) of the D-type flip-flop 23a is connected to a power source line (VDD) having a high level, thereby being pulled up, and the clock input terminal (CK, active at Hi) thereof is connected to the watchdog input terminal 21a.

In addition, the positive-side output terminal (Q) of the D-type flip-flop 23a is connected to the reset input terminal (RST) thereof via the delay circuit 23b. The delay circuit 23b is configured as an integration circuit composed of a resistor and a capacitor. Furthermore, the output side of the delay circuit 23b is connected to the clear input terminal CLR of the counter 25 via the diode D1. However, the input side of the delay circuit 23b may be connected to the diode D1.

In the example shown in FIG. 2, the D-type flip-flop 23a latches (holds) the level of the data input terminal (D) at the timing of the rising edge of the signal applied to the clock input terminal (CK) and outputs the held level to the output terminal (Q). Furthermore, when an effective set level "Hi" is applied to the reset input terminal (RST), the D-type flip-flop 23a is reset to its initial state.

Moreover, in the example shown in FIG. 2, the negative edge detection circuit 24 includes a D-type flip-flop (DFF) 24a and a delay circuit 24b. The data input terminal (D) of the D-type flip-flop 24a is connected to the power source line (VDD) having a high level, thereby being pulled up, and the clock input terminal (CK, active at Lo) thereof is connected to the watchdog input terminal 21a.

Still further, the positive-side output terminal (Q) of the D-type flip-flop 24a is connected to the reset input terminal (RST) thereof via the delay circuit 24b. What's more, the output side of the delay circuit 24b is connected to the clear input terminal CLR of the counter 25 via the diode D2. However, the input side of the delay circuit 24b may be connected to the diode D2.

In the example shown in FIG. 2, the D-type flip-flop 24a latches (holds) the level of the data input terminal (D) at the timing of the falling edge of the signal applied to the clock input terminal (CK) and outputs the held level to the output terminal (Q). Furthermore, when an effective set level "Hi" is applied to the reset input terminal (RST), the D-type flip-flop 24a is reset to its initial state.

Consequently, the level at the output terminal (Q) of the D-type flip-flop 23a is switched from "Lo" to "Hi" at the rising edge of the pulse of the watchdog signal SGw/d appearing at the watchdog input terminal 21a. Since this signal "Hi" is applied to the reset input terminal (RST) of the D-type flip-flop 23a while being delayed slightly by the delay circuit 23b, the D-type flip-flop 23a is reset immediately, and the level at the output terminal (Q) of the D-type flip-flop 23a returns to "Lo".

In other words, when the rising edge of the pulse of the watchdog signal SGw/d appears at the watchdog input terminal 21a, a pulse that becomes "Hi" for only a very short time width is output to the output terminal (Q) of the D-type flip-flop 23a. A pulse becoming "Hi" for only a constant time can be output securely using the delay circuit 23b.

In addition, the level at the output terminal (Q) of the D-type flip-flop 24a is switched from "Lo" to "Hi" at the falling edge of the pulse of the watchdog signal SGw/d appearing at the watchdog input terminal 21a. Since this signal "Hi" is applied to the reset input terminal (RST) of the D-type flip-flop 24a while being delayed slightly by the delay circuit 24b, the D-type flip-flop 24a is reset immediately, and the level at the output terminal (Q) of the D-type flip-flop 24a returns to "Lo".

In other words, when the falling edge of the pulse of the watchdog signal SGw/d appears at the watchdog input terminal 21a, a pulse that becomes "Hi" for only a very short time width is output to the output terminal (Q) of the D-type flip-flop 24a. A pulse that becomes "Hi" for only a constant time can be output securely using the delay circuit 24b.

As a result, in the clear signal SGcr serving as the logical OR of the output signal of the diode D1 and the output signal of the diode D2, a pulse appears for only a short time at each of both the rising and falling timings of the pulse of the watchdog signal SGw/d.

<Description of the Backup Signal Generating Section 22>

The backup signal generating section 22 shown in FIG. 1 is constituted as a latch circuit 27 using a D-type flip-flop. The data input terminal (D) of the latch circuit 27 is connected to the power source line (VDD) having a high level via a resistor, thereby being pulled up. In addition, the clock input terminal (CK, active at Hi) of the latch circuit 27 is connected to the third-bit output signal (Q3) of the counter 25 via the input terminal 22b of the backup signal generating section 22.

In other words, when the level of the signal output from the output terminal (Q3) of the counter 25 is switched from "Lo" to "Hi", the latch circuit 27 latches "Hi" of the data input terminal (D) thereof and outputs the signal as a backup control signal SGbk.

<Description of the Operation>

Figure 3:
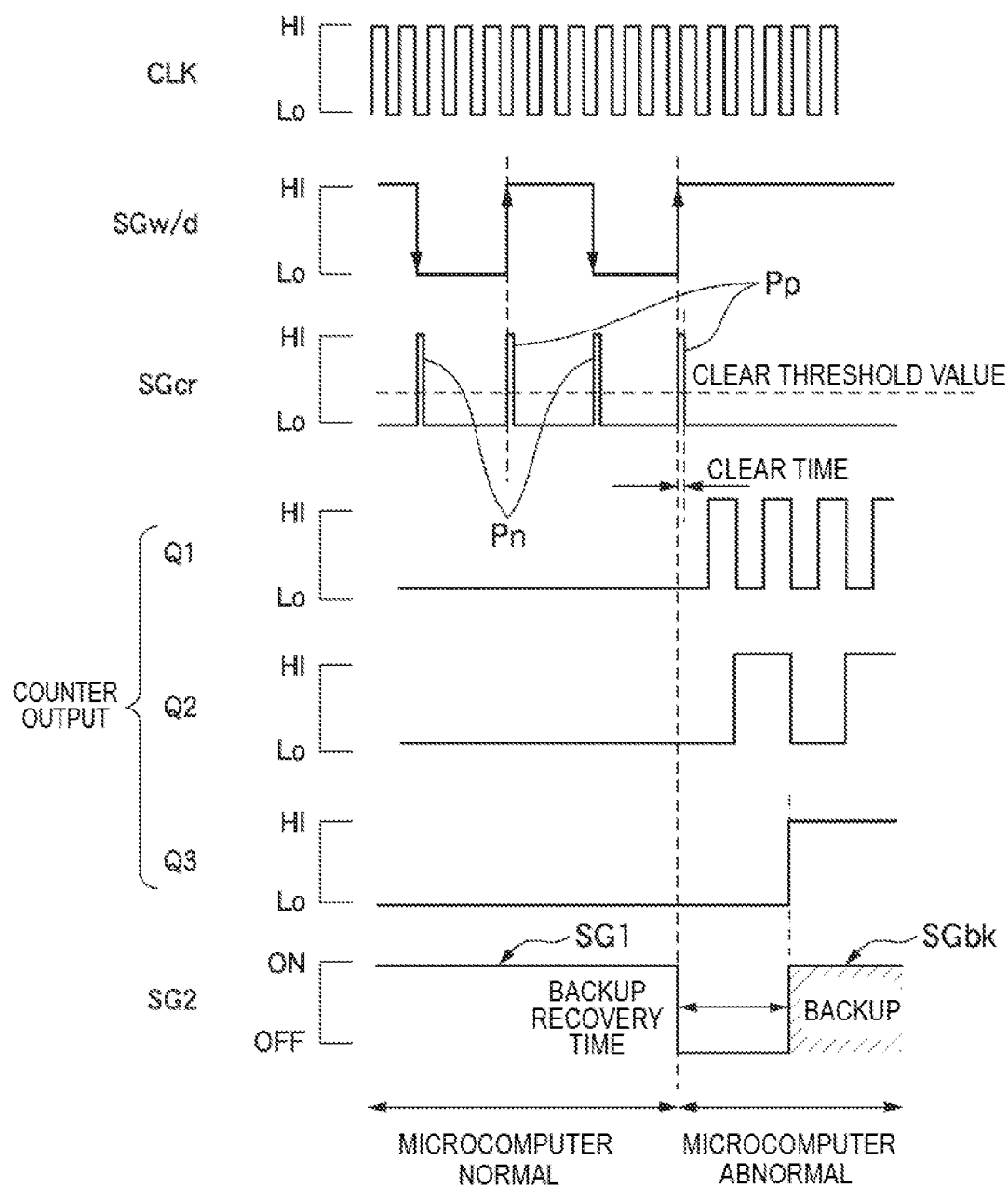
FIG. 3 is a time chart showing an operation example of the circuit shown in FIG. 1.
Figure 4:
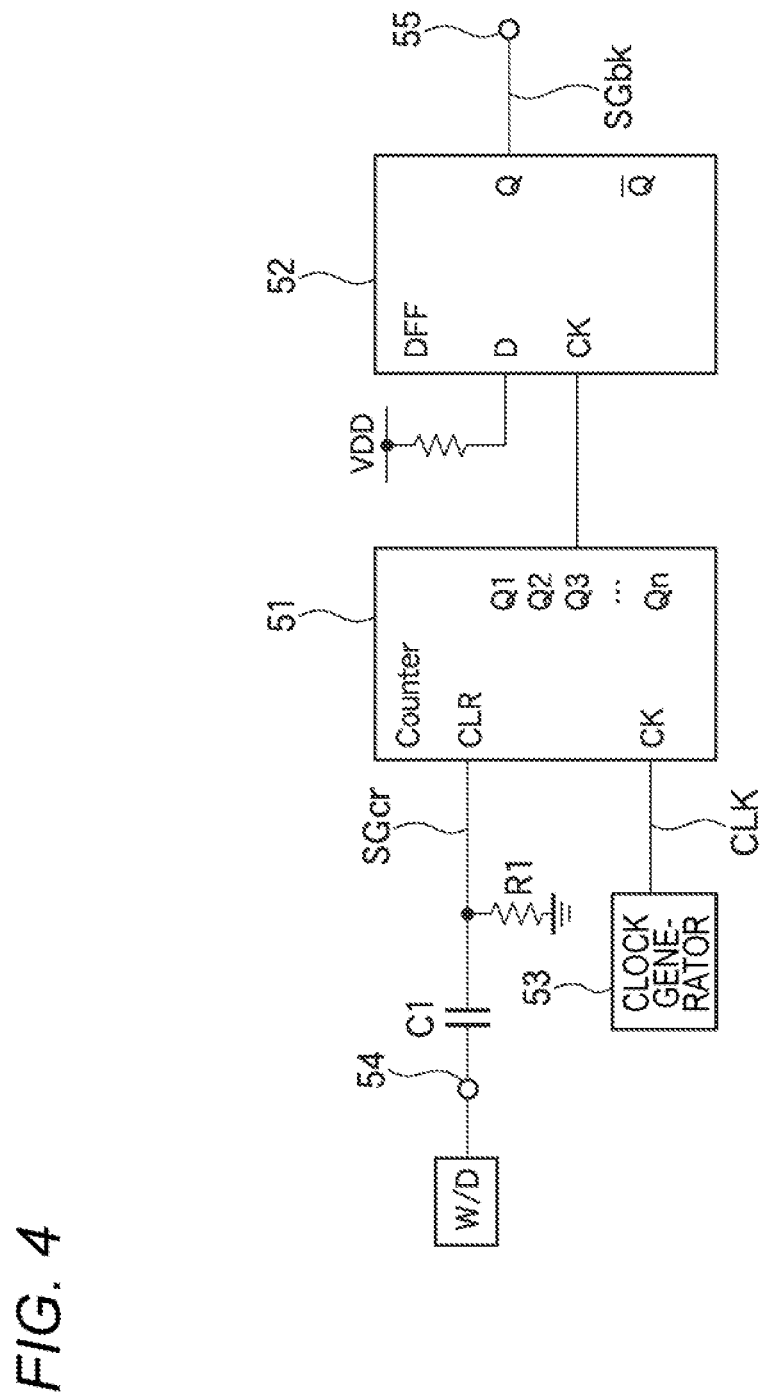
FIG. 4 is an electric circuit diagram showing a configuration example of a constant period signal monitoring circuit.

An operation example of the circuit shown in FIG. 1 is shown in FIG. 3. The operation shown in FIG. 3 is described below.

Pulses having a constant period always appear in the clock pulse signal CLK. Furthermore, when the microcomputer 10 operates normally, the level of the watchdog signal output port 12 changes each time the microcomputer 10 executes one of various routines, whereby pulses having a nearly constant period appear repeatedly as the watchdog signal SGw/d.

At the time when the pulses appear in the watchdog signal SGw/d as described above, the positive edge detection circuit 23 outputs a pulse Pp having a short time length at each of the rising edges of the pulses of the watchdog signal SGw/d as shown in FIG. 3. Furthermore, the negative edge detection circuit 24 outputs a pulse Pn having a short time length at each of the falling edges of the pulses of the watchdog signal SGw/d as shown in FIG. 3.

When the pulse Pp or Pn appears in the clear signal SGcr, the count value of the counter 25 is cleared at the timing of the appearance, and the counting operation stops. However, since the "Hi" time width of each of the pulses Pp and Pn is short, the "clear time" in FIG. 3 becomes short, and the clear signal SGcr returns to "Lo" immediately after the output of the pulses Pp and Pn. Hence, the counter 25 resumes the counting of the clock pulses after the output of the pulses Pp and Pn.

Figure 5:
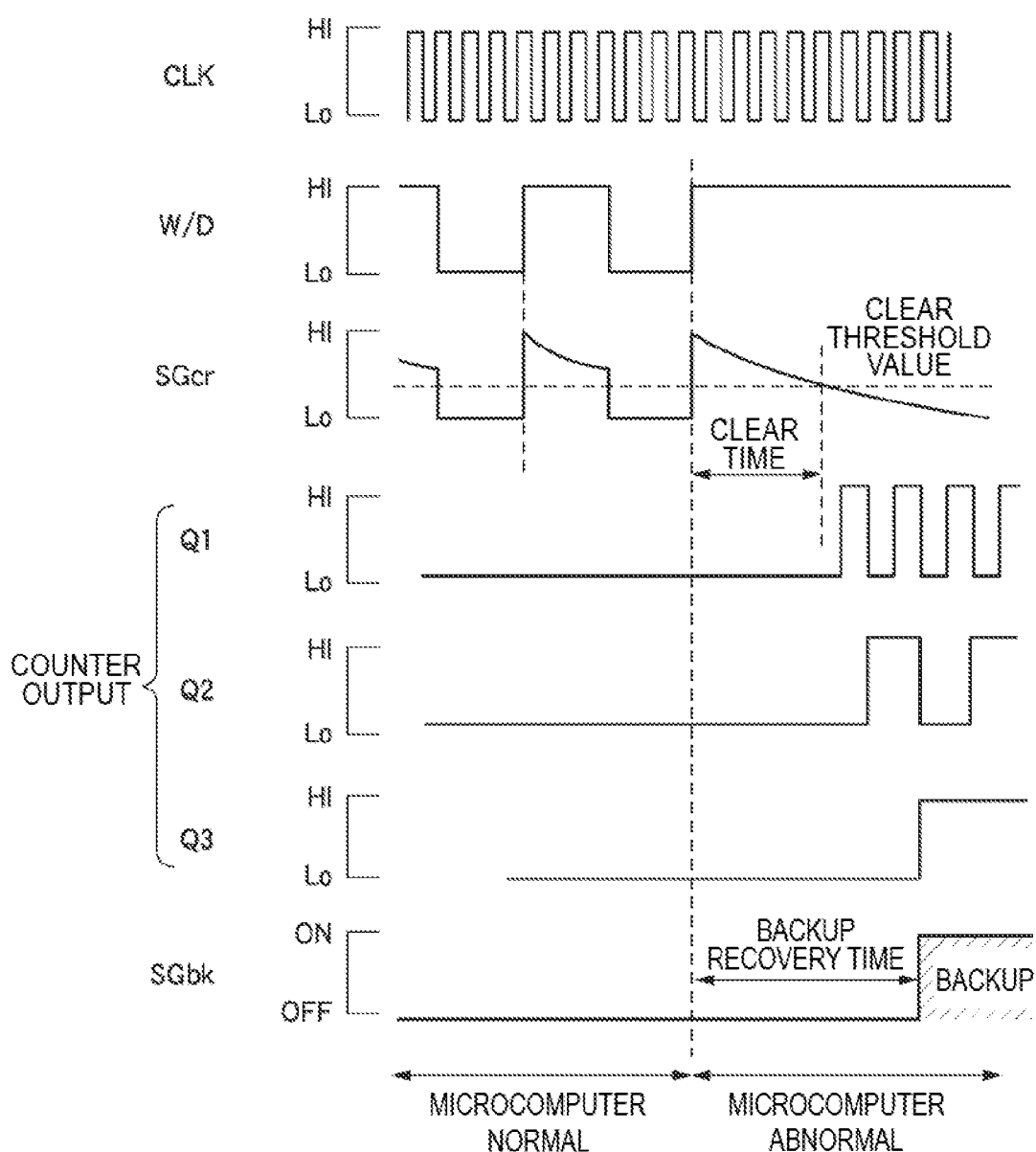
FIG. 5 is a time chart showing an operation example of the constant period signal monitoring circuit.

It is found that the "clear time" shown in FIG. 3 is far shorter than the "clear time" shown in FIG. 5. In other words, since the positive edge detection circuit 23 and the negative edge detection circuit 24 output pulses having a short time width, the "clear time" can be shortened.

The level (Hi/Lo) of the signal appearing at each of the respective bit outputs (Q1 to Qn) of the counter 25 changes to the level representing a count value along with the progress of the counting operation in the counter 25. When the count value of the counter 25 becomes "4" in the decimal system, the level of the signal at Q3 is switched to "Hi" and the latch circuit 27 latches the "Hi" of the data input terminal (D) at the timing of the switching. As a result, "Hi (corresponding to the ON state of the load)" is output as the backup control signal SGbk.

When the operation of the microcomputer 10 is normal, the pulses of the watchdog signal SGw/d appear periodically, whereby the count value of the counter 25 is reset before the value becomes large. Hence, during the normal time, "Hi" is not output as the backup control signal SGbk and the energization control signal SG2 changes depending on the control signal SG1.

On the other hand, if abnormality occurs in the operation of the microcomputer 10, the pulse of the watchdog signal SGw/d stops in the "Lo" or "Hi" state. In this case, since the pulse Pp of the positive edge detection circuit 23 and the pulse Pn of the negative edge detection circuit 24 do not appear, the counter 25 continues the counting of the pulses of the clock pulse signal CLK. When a predetermined time elapses after the stop of the pulse of the watchdog signal SGw/d, the output (Q3) of the counter 25 becomes "Hi", and the latch circuit 27 outputs "Hi" as the backup control signal SGbk at this timing.

Consequently, even in the case that abnormality occurs in the microcomputer 10 and the control signal SG1 stops, the backup control signal SGbk appears in the energization control signal SG2 after the elapse of "backup recovery time" as shown in FIG. 3. The energization of the load 31 can be controlled using the backup control signal SGbk even if abnormality occurs in the microcomputer 10.

<Possibility of Modification>

In the configuration shown in FIG. 1, although the latch circuit 27 monitors the counter output signal output from the counting output terminal Q3 of the counter 25, the configuration may be modified so that any one of the signals output from Q1 to Qn is monitored as necessary. In other words, it is assumed that modification is made as necessary depending on the difference in the pulse period of the dock pulse signal CLK output from the dock generator 26 or according to the expectation value of the time required until the backup control signal SGbk starts after the output stop of the pulse of the watchdog signal SGw/d.

In the configuration shown in FIG. 1, although the constant period signal monitoring circuit 21 incorporates the clock generator 26, the clock generator 26 is not required to be incorporated in the constant period signal monitoring circuit 21, provided that an environment is available in which an external unit not shown) capable of outputting desired dock pulses can be connected to the constant period signal monitoring circuit 21.

In the configuration shown in FIG. 1, when the output of the pulse of the watchdog signal SGw/d stops and the backup control signal SGbk is turned on, the switching device 32 is turned on, and the load 31 is set to a normally energized state. However, for example, in the case that the load 31 is desired to be controlled manually, it is assumed that the energization control signal SG2 is controlled using the logical OR or logical AND of a signal changing depending on the setting of a predetermined operation switch and the backup control signal SGbk.

Furthermore, although the constant period signal monitoring circuit 21 and the backup signal generating section 22 shown in FIG. 1 identify the presence or absence of abnormality on the basis of only the state of the pulse of the watchdog signal SGw/d, another signal, such as the control signal SG1, may be monitored at the same time.

The characteristics of the above-mentioned embodiment of the constant period signal monitoring circuit and the backup signal generating section according to the present invention will be briefly summarized and listed in the following items [1] to [7].

[1] A constant period signal monitoring circuit (21) for monitoring a constant period signal (watchdog signal SGw/d) that is output periodically when a control processor (microcomputer 10) operating according to a program is normal from the outside of the control processor, the monitoring circuit including:
a signal input terminal (watchdog input terminal 21a) that receives the constant period signal;
an edge detection section (positive edge detection circuit 23, negative edge detection circuit 24) that detects a change of the constant period signal appearing at the signal input terminal from a low level to a high level or from a high level to a low level as an edge of the constant period signal; and
a time measuring section (counter 25) that measures a length of the time during which a state of not detecting the edge continues on the basis of an output of the edge detection section and outputs an abnormality detection signal in a case that the measured time exceeds a threshold value.

[2] The constant period signal monitoring circuit described in the above-mentioned item [1], wherein the edge detection section including:
a positive edge detection section (positive edge detection circuit 23) that detects the change of the constant period signal appearing at the signal input terminal from the low level to the high level as a positive edge of the constant period signal; and
a negative edge detection section (negative edge detection circuit 24) that detects the change of the constant period signal appearing at the signal input terminal from the high level to the low level as a negative edge of the constant period signal; and
wherein the time measuring section measures a length of the time during which a state of not detecting the positive edge and the negative edge continues on the basis of an output of the positive edge detection section and an output of the negative edge detection section and outputs an abnormality detection signal in the case that the measured time exceeds a threshold value.

[3] The constant period signal monitoring circuit described in the above-mentioned item [2], wherein the time measuring section includes a clear signal generating section (diodes D1 and D2) that generates a signal (clear signal SGcr) for clearing the measured time when the positive edge detection section detects the positive edge or when the negative edge detection section detects the negative edge.

[4] The constant period signal monitoring circuit described in the above-mentioned item [2], wherein the positive edge detection section outputs a positive edge pulse signal (Pp) when the detection section detects the positive edge; and
wherein the negative edge detection section outputs a negative edge pulse signal (Pn) when the detection section detects the negative edge.

[5] The constant period signal monitoring circuit described in the above-mentioned item [4], wherein the positive edge detection section includes:
a first flip-flop (D-type flip-flop 23a) that is set when the positive edge is detected: and
a first delay circuit (23b) that automatically resets the first flip-flop after the first flip-flop is set; and
wherein the negative edge detection section includes:
a second flip-flop (D-type flip-flop 24a) that is set when the negative edge is detected; and
a second delay circuit (24b) that automatically resets the second flip-flop after the second flip-flop is set.

[6] The constant period signal monitoring circuit described in the above-mentioned item [2], wherein the time measuring section includes:
a clock generating section (clock generator 26) that outputs clock pulses having a constant period; and
a counter (25) that counts the number of the clock pulses.

[7] A load control backup signal generating circuit (constant period signal monitoring circuit 21, backup signal generating section 22) for supplying a backup control signal (SGbk) to a switch (switching device 32) of a load (31) connected to an output of a control processor (microcomputer 10) operating according to a program in a case that abnormality occurs in the control processor, the circuit including:
a signal input terminal (watchdog input terminal 21a) that receives a constant period signal (watchdog signal SGw/d) that is output periodically when the control processor is normal;
an edge detection section (positive edge detection circuit 23, negative edge detection circuit 24) that detects a change of the constant period signal appearing at the signal input terminal from a low level to a high level or from a high level to a low level as an edge of the constant period signal;
a time measuring section (counter 25) that measures a length of the time during which a state of not detecting the edge continues on the basis of an output of the edge detection section and that outputs an abnormality detection signal in a case that the measured time exceeds a threshold value; and
a backup signal output section (latch circuit 27) that generates the backup control signal when the abnormality detection signal appears at the output of the time measuring section.

What is claimed is:

1. A constant period signal monitoring circuit for monitoring a constant period signal that is output periodically when a control processor operating according to a program is normal from the outside of the control processor, the monitoring circuit comprising:
a signal input terminal that receives the constant period signal;
an edge detection section that detects a change of the constant period signal appearing at the signal input terminal from a low level to a high level or from a high level to a low level as an edge of the constant period signal; and
a time measuring section that measures a length of the time during which a state of not detecting the edge continues on the basis of an output of the edge detection section and outputs an abnormality detection signal in a case that the measured time exceeds a threshold value.

2. The constant period signal monitoring circuit according to claim 1, wherein the edge detection section comprises:
a positive edge detection section that detects the change of the constant period signal appearing at the signal input terminal from the low level to the high level as a positive edge of the constant period signal; and
a negative edge detection section that detects the change of the constant period signal appearing at the signal input terminal from the high level to the low level as a negative edge of the constant period signal; and
wherein the time measuring section measures a length of the time during which a state of not detecting the positive edge and the negative edge continues on the basis of an output of the positive edge detection section and an output of the negative edge detection section and outputs the abnormality detection signal in the case that the measured time exceeds the threshold value.

3. The constant period signal monitoring circuit according to claim 2, wherein the time measuring section comprises a clear signal generating section that generates a signal for clearing the measured time when the positive edge detection section detects the positive edge or when the negative edge detection section detects the negative edge.

4. The constant period signal monitoring circuit according to claim 2, wherein the positive edge detection section outputs a positive edge pulse signal when the detection section detects the positive edge; and wherein the negative edge detection section outputs a negative edge pulse signal when the detection section detects the negative edge.

5. The constant period signal monitoring circuit according to claim 4, wherein the positive edge detection section comprises:
- a first flip-flop that is set when the detection section detects the positive edge; and
- a first delay circuit that automatically resets the first flip-flop after the first flip-flop is set; and wherein the negative edge detection section comprises:
- a second flip-flop that is set when the detection section detects the negative edge; and
- a second delay circuit that automatically resets the second flip-flop after the second flip-flop is set.

6. The constant period signal monitoring circuit according to claim 2, wherein the time measuring section comprises:
- a clock generating section that outputs clock pulses having a constant period; and
- a counter that counts the number of the clock pulses.

7. A load control backup signal generating circuit for supplying a backup control signal to a switch of a load connected to an output of a control processor operating according to a program in a case that abnormality occurs in the control processor, the circuit comprising:
- a signal input terminal that receives a constant period signal that is output periodically when the control processor is normal;
- an edge detection section that detects a change of the constant period signal appearing at the signal input terminal from a low level to a high level or from a high level to a low level as an edge of the constant period signal;
- a time measuring section that measures a length of the time during which a state of not detecting the edge continues on the basis of an output of the edge detection section and that outputs an abnormality detection signal in a case that the measured time exceeds a threshold value; and
- a backup signal output section that generates the backup control signal when the abnormality detection signal appears at the output of the time measuring section.

* * * * *